(12) United States Patent
Pellizzer et al.

(10) Patent No.: US 9,318,699 B2
(45) Date of Patent: Apr. 19, 2016

(54) RESISTIVE MEMORY CELL STRUCTURES AND METHODS

(75) Inventors: Fabio Pellizzer, Cornate d'Adda (IT); Ferdinando Bedeschi, Biassono (IT)

(73) Assignee: Micron Technology, Inc., Boise, ID (US)

( * ) Notice: Subject to any disclaimer, the term of this patent is extended or adjusted under 35 U.S.C. 154(b) by 879 days.

(21) Appl. No.: 13/352,680

(22) Filed: Jan. 18, 2012

(65) Prior Publication Data
US 2013/0181183 A1 Jul. 18, 2013

(51) Int. Cl.
*H01L 21/20* (2006.01)
*H01L 45/00* (2006.01)
*H01L 27/24* (2006.01)

(52) U.S. Cl.
CPC ............ *H01L 45/06* (2013.01); *H01L 27/2463* (2013.01); *H01L 45/126* (2013.01); *H01L 45/1233* (2013.01); *H01L 45/144* (2013.01); *H01L 45/165* (2013.01); *H01L 45/1675* (2013.01); *H01L 45/1683* (2013.01)

(58) Field of Classification Search
None
See application file for complete search history.

(56) References Cited

U.S. PATENT DOCUMENTS

| | | | |
|---|---|---|---|
| 7,385,245 B2 | 6/2008 | Bhattacharyya | |
| 7,422,926 B2 | 9/2008 | Pellizzer et al. | |
| 7,759,237 B2 | 7/2010 | Ahn et al. | |
| 7,952,937 B2 | 5/2011 | Bode | |
| 8,476,614 B2 | 7/2013 | Sumino et al. | |
| 2006/0131555 A1 | 6/2006 | Liu et al. | |
| 2007/0257300 A1 | 11/2007 | Ho et al. | |
| 2009/0014703 A1 | 1/2009 | Inaba | |
| 2009/0014836 A1 | 1/2009 | Lee et al. | |
| 2010/0046285 A1* | 2/2010 | Lung | |
| 2010/0195371 A1 | 8/2010 | Ohba et al. | |
| 2010/0308296 A1 | 12/2010 | Pirovano et al. | |
| 2011/0095255 A1 | 4/2011 | Sumino et al. | |
| 2011/0155988 A1 | 6/2011 | Ohba et al. | |
| 2012/0298946 A1 | 11/2012 | Magistretti et al. | |
| 2013/0181183 A1* | 7/2013 | Pellizzer et al. | 257/5 |
| 2014/0361238 A1* | 12/2014 | Joshi et al. | 257/5 |

FOREIGN PATENT DOCUMENTS

| | | | |
|---|---|---|---|
| JP | 2011091325 A | 5/2011 | |
| KR | 10-2007-0026157 A | 3/2007 | |
| KR | 10-2009-0038065 A | 4/2009 | |

OTHER PUBLICATIONS

International Search Report and Written Opinion for related PCT Application PCT/US2013/022189, Mailed May 15, 2013 (12 pgs.).
Notice of Reasons for Rejection from related Korean patent application No. 10-2014-7022258, dated Mar. 31, 2015, 12 pp.
Supplementary Search Report from related European patent application number 13739105.8, dated Jul. 24, 2015, 5 pp.

* cited by examiner

*Primary Examiner* — Jack Chen
(74) *Attorney, Agent, or Firm* — Brooks, Cameron & Huebsch, PLLC

(57) ABSTRACT

Resistive memory cell structures and methods are described herein. One or more memory cell structures comprise a first resistive memory cell comprising a first resistance variable material and a second resistive memory cell comprising a second resistance variable material that is different than the first resistance variable material.

7 Claims, 15 Drawing Sheets

RESISTIVE MEMORY CELL STRUCTURES AND METHODS

TECHNICAL FIELD

The present disclosure relates generally to semiconductor memory devices and methods, and more particularly, to resistive memory cell structures and methods.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), flash memory, resistive memory, such as phase change random access memory (PCRAM) and resistive random access memory (RRAM), and magnetic random access memory (MRAM), such as spin torque transfer random access memory (STT RAM), among others.

Memory devices are utilized as non-volatile memory for a wide range of electronic applications in need of high memory densities, high reliability, and data retention without power. Non-volatile memory may be used in, for example, personal computers, portable memory sticks, solid state drives (SSDs), digital cameras, cellular telephones, portable music players such as MP3 players, movie players, and other electronic devices.

Resistive memory devices, such as PCRAM devices, can include a resistance variable material such as a phase change material, for instance, which can be programmed into different resistance states to store data. The particular data stored in a phase change memory cell can be read by sensing the cell's resistance, e.g., by sensing current and/or voltage variations based on the resistance of the phase change material.

DETAILED DESCRIPTION

Figure 1:
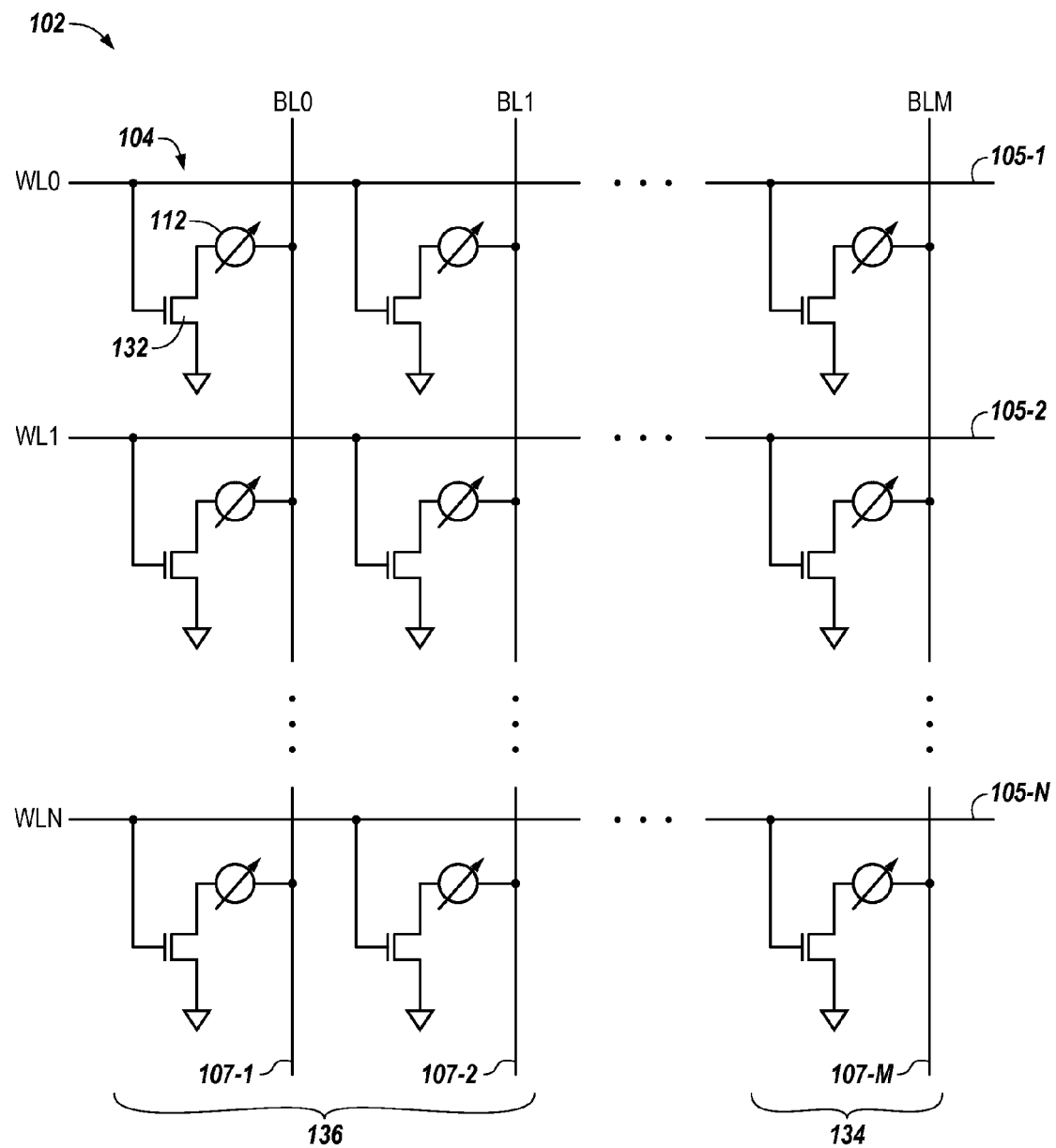
FIG. 1 is a schematic diagram of a portion of a resistive memory array in accordance with a number of embodiments of the present disclosure.

Resistive memory cell structures and methods are described herein. As an example, an array of resistive memory cells can include a first resistive memory cell comprising a first resistance variable material and a second resistive memory cell comprising a second resistance variable material that is different than the first resistance variable material.

In a number of embodiments, an array of resistive memory cells includes a first region, e.g., portion, comprising memory cells formed to provide increased speed, e.g., program throughput, and longer endurance, e.g., increased cycling ability, as compared to a second, e.g., different, region of the array. The second region of the array can comprise cells formed to provide an increased reliability, e.g., temperature retention capability, as compared to the cells of the first region of the array. As an example, the first region of the array may be more suitable for data manipulation, while the second region may be more suitable for code storage, e.g., storage of sensitive data, or for data backup.

A region with increased retention capability, as compared to a different region, can also include the region specified to retain data at a higher temperature at a given time than the different region, as well as the region specified to retain data at a give temperature for an increased time period than the different region.

In a number of embodiments, the cells of the first region of the array can comprise a different resistance variable material, e.g., a different chalcogenide alloy, than the cells of the second region. For instance, the cells of the first region may comprise a phase change material, such as, $Ge_8Sb_5Te_8$, which may be more suited to a higher retention than the cells of the second region, which may comprise a phase change material, such as $Ge_2Sb_2Te_6$, which may be more suited to increased throughput, e.g., faster set-ability.

In a number of embodiments, the memory cells of the first region and of the second region can comprise the same resistance variable material. In some such embodiments, different reactant materials can be formed on the resistance variable materials of the cells of the respective first and second regions, which can provide for different cell characteristics, e.g., retention capability and/or cycling ability, between the cells of the respective first and second regions. In a number of embodiments, the cell characteristics between the cells of the respective first and second regions of the array can be different due to forming a particular reactant material to a different thickness on the cells of the first region as compared to the cells of the second region.

In one or more embodiments in which the same resistance variable material is used to form the memory cells of the first and second regions of the array, the electrothermal properties of the resistance variable materials of the first and/or second regions can be modified, e.g., via ion implantation, such that the cell characteristics of the cells of the respective first and second regions are different. As such, embodiments of the present disclosure can provide benefits such as providing the ability to tailor the cell characteristics of different regions of a memory array to achieve desired cell characteristics, among other benefits.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. For example, 102 may reference element "02" in FIG. 1, and a similar element may be referenced as 202 in FIG. 2. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

FIG. 1 is a schematic diagram of a portion of a resistive memory array 102 in accordance with one or more embodiments of the present disclosure. The resistive memory array 102 includes a number of memory cells 104, each including a select device 132 coupled to a resistive storage element 112. The memory cells 104 can be formed in accordance with embodiments described herein.

The resistive storage elements 112 can include a resistance variable material, e.g., a phase change material. The phase change material can be a chalcogenide, e.g., a Ge—Sb—Te (GST) material such as $Ge_8Sb_5Te_8$, $Ge_2Sb_2Te_5$, $Ge_1Sb_2Te_4$, $Ge_1Sb_4Te_7$, etc., among other resistance variable materials. The hyphenated chemical composition notation, as used herein, indicates the elements included in a particular mixture or compound, and is intended to represent all stoichiometries involving the indicated elements. Other phase change materials can include Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, for example.

The select devices 132 may be field effect transistors, e.g., metal oxide semiconductor field effect transistors (MOSFETs), ovonic threshold switches (OTS), bipolar junction transistors (BJTs) or diodes, among other types of select devices. Although the select device 132 shown in FIG. 1 is a three terminal select device, the select devices can be two terminal select devices, for instance.

In the example illustrated in FIG. 1, the select device 132 is a gated three terminal field effect transistor. As shown in FIG. 1, a gate of each select device 132 is coupled to one of a number of access lines 105-1, 105-2 . . . , 105-N, i.e., each access line 105-1, 105-2, . . . , 105-N is coupled to a row of memory cells 104. The access lines 105-1, 105-2, . . . , 105-N may be referred to herein as "word lines." The designator "N" is used to indicate that the resistive memory array 102 can include a number of word lines.

In the example illustrated in FIG. 1, each resistive storage element 112 is coupled to one of a number of data/sense lines 107-1, 107-2, . . . , 107-M, i.e., each data line 107-1, 107-2, . . . , 107-M is coupled to a column of memory cells 104. The data lines 107-1, 107-2, . . . , 107-M may be referred to herein as "bit lines." The designator "M" is used to indicate that the resistive memory array 102 can include a number of bit lines. The designators M and N can have various values. For instance, M and N can be 64, 128, or 256. In some embodiments, a bit line direction is perpendicular to a word line direction, e.g., the rows of memory cells 104 and the columns of memory cells 104 are perpendicular to one another.

In a number of embodiments, data lines 107-1 and 107-2 can be grouped into a sub-array 136, and other data lines (e.g., data line 107-M) can be grouped into a sub-array 134. In the example illustrated in FIG. 1, a memory cell coupled to bit line 107-1 is adjacent to a memory cell coupled to bit line 107-2. Embodiments are not limited to a particular number of word lines and/or bit lines or a particular number of sub-arrays.

The select devices 132 can be operated, e.g., turned on/off, to select/deselect the memory cells 104 in order to perform operations such as data programming, e.g., writing, and/or data reading operations. In operation, appropriate voltage and/or current signals, e.g., pulses, can be applied to the bit lines and word lines in order to program data to and/or read data from the memory cells 104. As an example, the data stored by a memory cell 104 of array 102 can be determined by turning on a select device 132, and sensing a current through the resistive storage element 112. The current sensed on the bit line corresponding to the memory cell 104 being read corresponds to a resistance level of the resistance variable material of resistive storage element 112, which in turn may correspond to a particular data state, e.g., a binary value. The resistive memory array 102 can have an architecture other than that illustrated in FIG. 1, as will be understood by one of ordinary skill in the art.

FIGS. 2A-2E illustrate various process stages associated with forming an array 202 of resistive memory cells in accordance with a number of embodiments of the present disclosure. In a number of embodiments, the resistive memory cells may be coupled to a same bit line. The memory cells of array 202 can be resistive memory cells such as resistive memory cells 104, as described above. As an example, the array 202 can be an array of phase change memory cells.

Figure 2A:
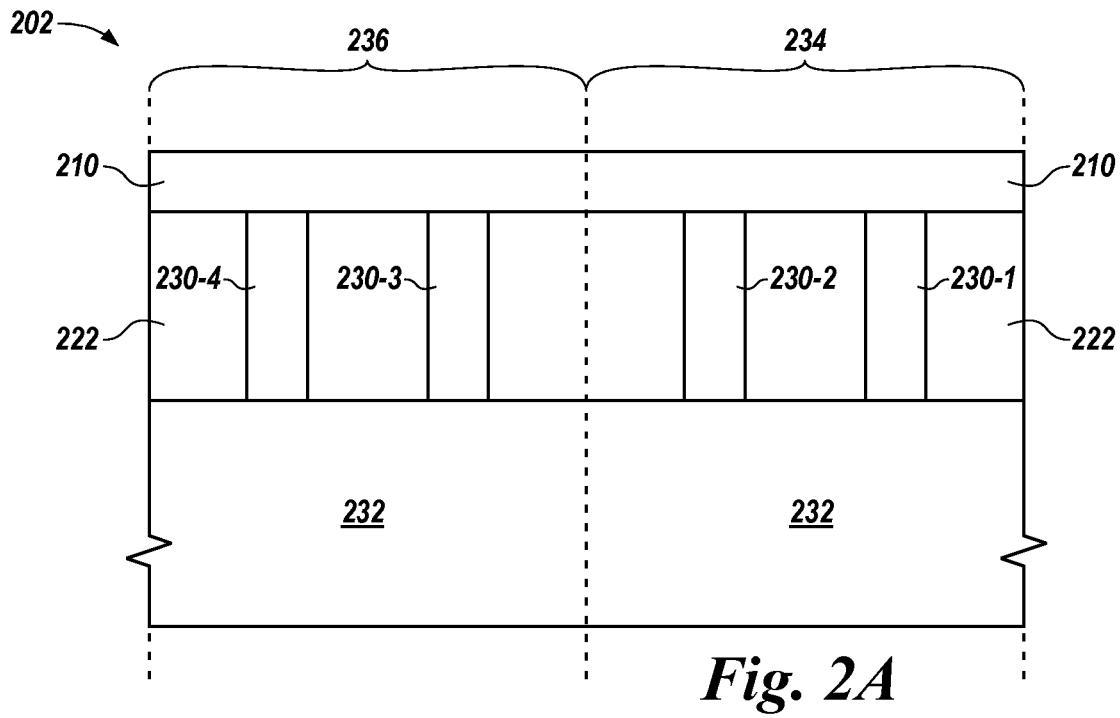
FIGS. 2A-2E illustrate various process stages associated with forming an array of resistive memory cells in accordance with a number of embodiments of the present disclosure.

FIG. 2A illustrates a first region 234 and a second region 236 of array 202. In the example shown in FIG. 2A, regions 234 and 236 include conductive plugs 230-1, . . . , 230-4 formed between a heater material 210, e.g., a conductive material, and a substrate 232. The conductive plugs 230-1, . . . , 230-4 are separated by a dielectric material 222 formed on substrate 232. The dielectric material 222 can be a material such as silicon dioxide or silicon nitride, for instance. The substrate 232 can be a silicon substrate, silicon on insulator (SOT) substrate, or silicon on sapphire (SOS) substrate, for instance, and can include various doped and/or undoped semiconductor materials.

Although not shown in FIG. 2A, select devices corresponding to the memory cells of regions 234 and 236 can be formed in substrate 232. As described further herein, resistive memory cells of region 234 can be formed so as to exhibit different cell characteristics as compared to the resistive memory cells of region 236. For instance; the cells of the respective regions 234 and 236 may comprise resistance variable materials having different characteristics, e.g., different electrothermal properties, such that cell characteristics of the cells of the respective regions 234 and 236 are different.

The heater material 210 is formed on plugs 230-1, . . . , 230-4 and can be various conductive materials such as a metal nitride, e.g., tungsten nitride and/or titanium nitride, among other conductive materials. In a number of embodiments, heater material 210 is limited in a direction perpendicular to the rows of memory cells (not shown) prior to a material, e.g., a resistance variable material, being formed on the heater material 210. As used herein, a material being "formed on" another material is not limited to the materials being formed directly on each other. For instance, a number of intervening materials can be formed between a first material formed on a second material, in various embodiments.

Figure 2B:
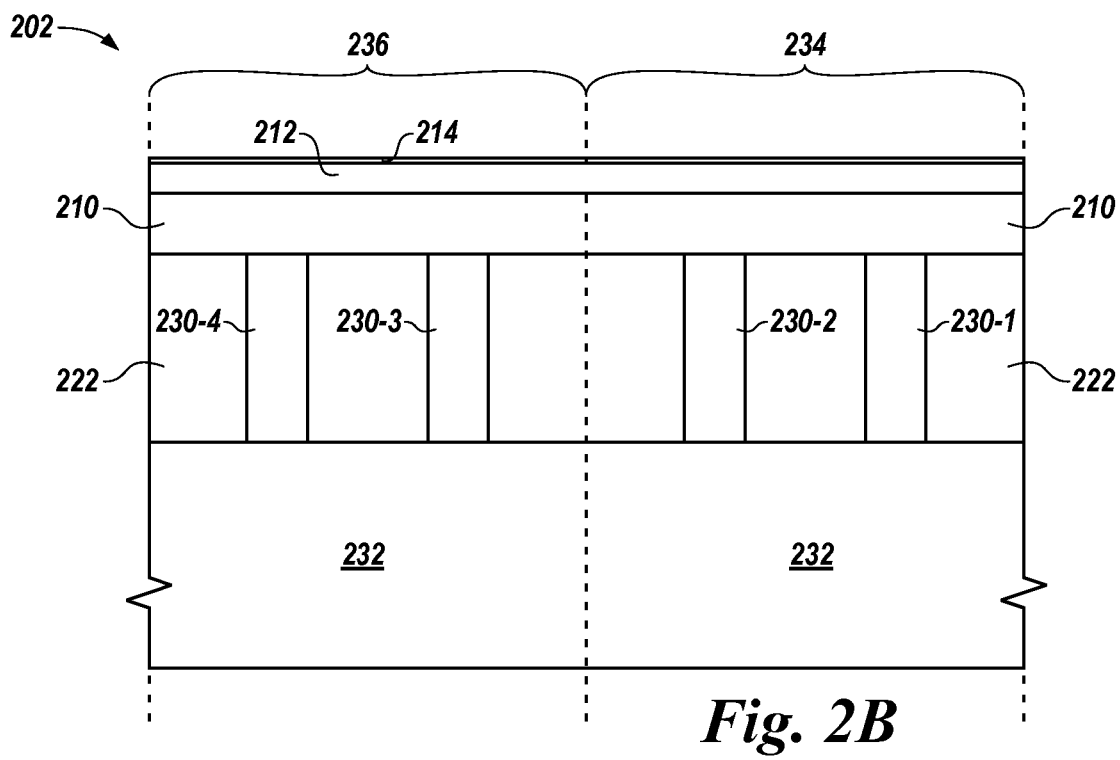

FIG. 2B illustrates a process stage subsequent to that shown in FIG. 2A and associated with forming array 202. A resistance variable material 212, e.g., a phase change material, is formed on heater material 210. That is, the heater material 210 of regions 234 and 236 includes resistance variable material 212 formed thereon.

As illustrated in FIG. 2B, a reactant material 214 is formed on the resistance variable material 212 in regions 234 and 236. The reactant material 214 can be a metal reactant, such as, for example, a reactant comprising titanium, cobalt, and/or tungsten, for instance. Reactant material 214 can serve as a portion of a cap formed on resistance variable material 212.

Figure 2C:
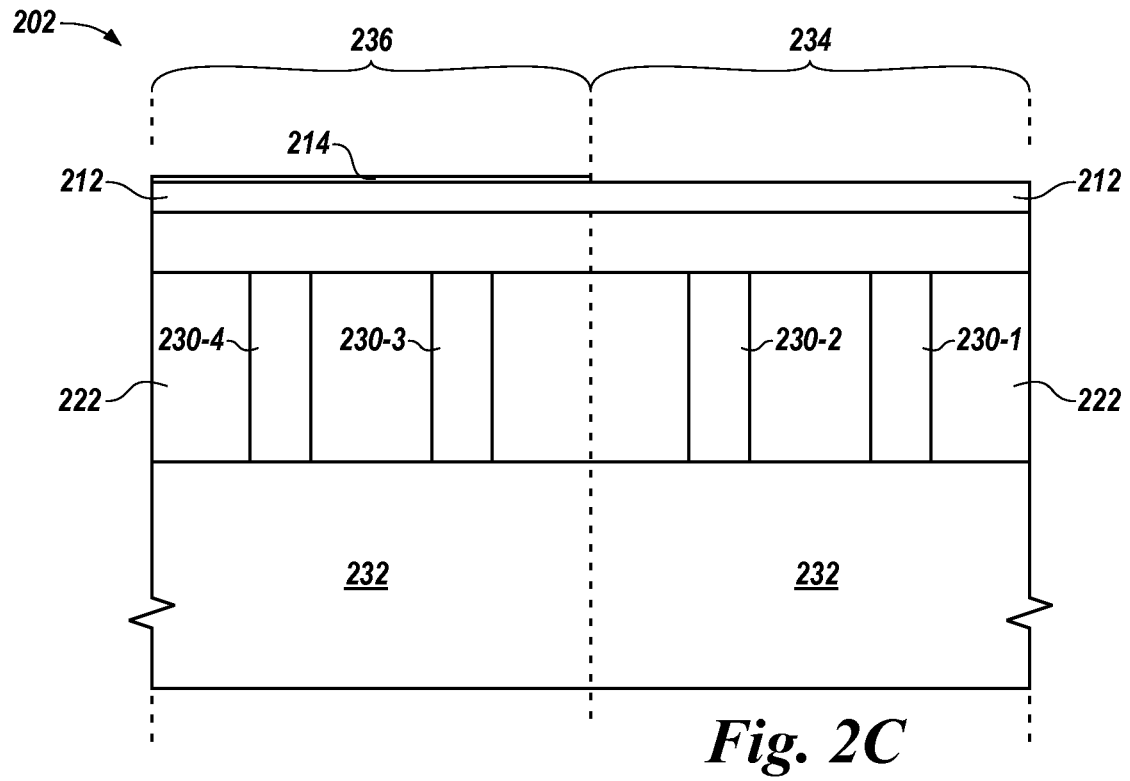

FIG. 2C illustrates a portion of reactant material 214 removed from region 234 of array 202. The reactant material 214 can be removed from region 234 via an etch process, for instance, without removing the reactant material 214 from region 236.

Figure 2D:
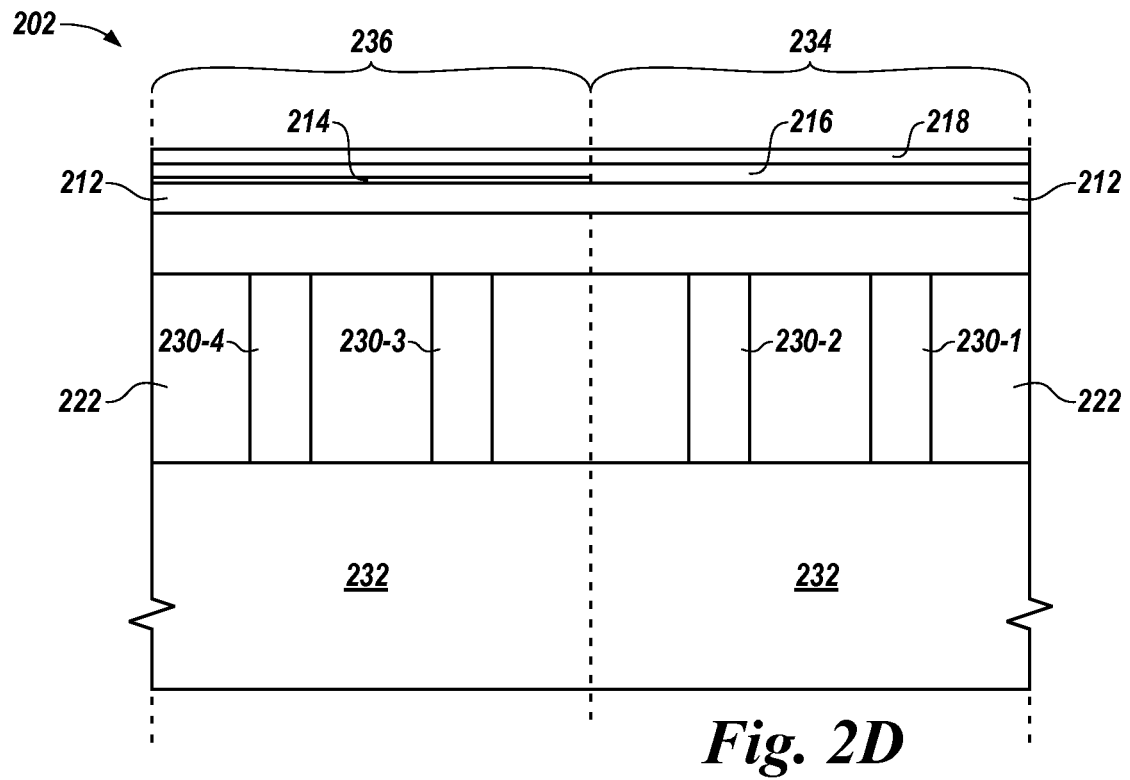

FIG. 2D illustrates a process stage subsequent to that shown in FIG. 2C and associated with forming array 202. FIG. 2D illustrates a reactant material 216 formed on regions 234 and 236. As such, reactant material 216 is formed on resistance variable material 212 in region 234 and on reactant material 214 in region 236. Reactant material 216 can be a metal reactant, such as, for example, a reactant comprising titanium, cobalt, and/or tungsten, among others. Reactant material 216 can be the same material as reactant material 214, or it can be a different reactant material. Also, reactants 214 and 216 may be formed to the same or different thicknesses.

Providing different reactant materials, e.g., reactant materials 214 and 216, in different regions, e.g., regions 234 and 236, of an array can be used to form memory cells having different cell characteristics, e.g., electrothermal properties, within the respective array regions. For instance, reactant material 214 can react with resistance variable material 212 in region 236, and a different reactant material 216 can react with resistance variable material 212 in region 234. In a number of embodiments, the reactions are thermally activated. The reactants 214 and 216 react differently with the resistance variable material 212 in the respective regions 236 and 234. As such, the electrothermal properties of the resistance variable material 212 in regions 234 and 236 can be modified with respect to each other. Therefore, resistive memory cells formed in region 234 can exhibit different cell characteristics as compared to the cell characteristics of cells formed in region 236.

In a number of embodiments, the reactant materials 214 and 216 can be the same material. In such embodiments, a thickness of the reactant material 214/216 formed in the respective regions 234 and 236 can be different. Providing different thickness of a same reactant material 214/216 in different regions of an array can also affect the cell characteristics within the respective regions, e.g., regions 234 and 236. For instance, cells formed in a region, e.g., region 236, having a thicker reactant material may exhibit a higher retention as compared to cells formed in a region, e.g., region 234, having a thinner reactant material. Cells formed in a region, e.g., region 234, having a thinner reactant material may exhibit a higher programming throughput as compared to cells formed in a region, e.g., region 236, having a thicker reactant material.

FIG. 2D also illustrates a cap material 218, e.g., a conductive material, formed on reactant material 216 in regions 234 and 236. The cap material 218 can comprise a metal nitride such as titanium nitride and/or tungsten nitride, among various other cap materials.

Figure 2E:
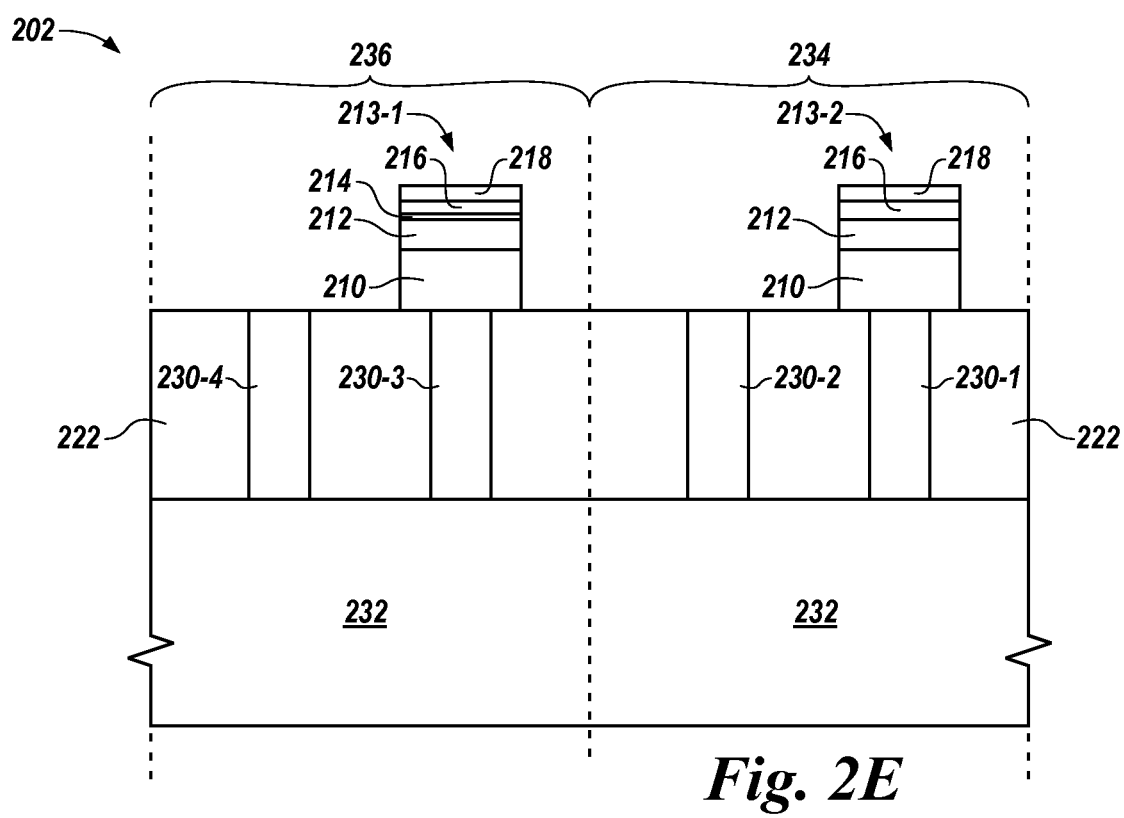

FIG. 2E illustrates a process stage subsequent to that shown in FIG. 2D and associated with forming array 202. As shown in FIG. 2E, individual resistive memory cells 213-1 and 213-2 can be defined by removing portions of materials 210, 212, 214, 216, and 218. In a number of embodiments, resistance variable material 212 is between two conductive elements, e.g., between a conductive cap material 218 and a heater material 210. In this example, the memory cells 213-1 and 213-2 are self-aligned and can be formed via a number of masking and etching processes, for instance.

Although the example shown in FIGS. 2A-2E is for an array of phase change memory cells, embodiments are not so limited. For instance, in a number of embodiments, the array 202 can be an array of RRAM cells or other resistive memory cells having separate regions with different cell characteristics.

FIGS. 3A-3F illustrate various process stages associated with forming array 302 of resistive memory cells in accordance with a number of embodiments of the present disclosure. The memory cells of array 302 can be resistive memory cells such as resistive memory cells 104, as described above. As an example, the array 302 can be an array of phase change memory cells.

Figure 3A:
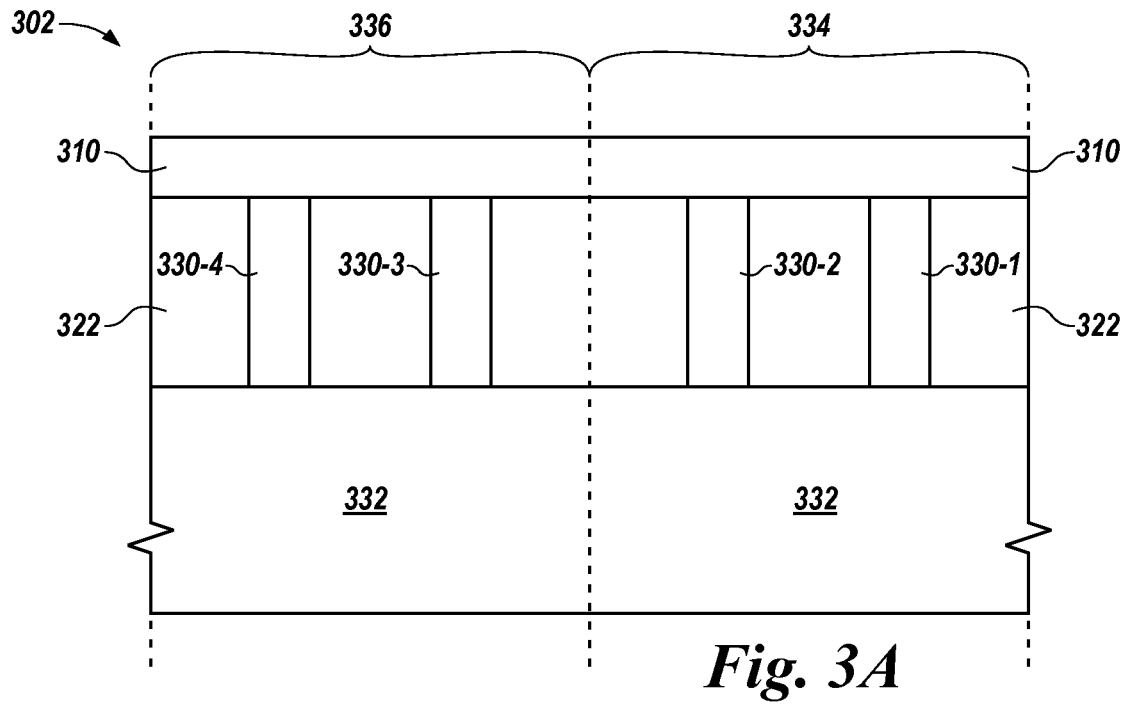
FIGS. 3A-3F illustrate various process stages associated with forming an array of resistive memory cells in accordance with a number of embodiments of the present disclosure.

FIG. 3A illustrates a first region 334 and a second region 336 of array 302. In the example shown in FIG. 3A, regions 334 and 336 include conductive plugs 330-1, . . . , 330-4 formed between a heater material 310, e.g., a conductive material, and a substrate 332. In a number of embodiments, heater material 310 is limited in a direction perpendicular to the rows of memory cells (not shown) prior to a material, e.g., a resistance variable material, being formed on the heater material 310.

The conductive plugs 330-1, . . . , 330-4 are separated by a dielectric material 322 formed on substrate 332. The dielectric material 322 can be a material such as silicon dioxide or silicon nitride, for instance. The substrate 332 can be a silicon substrate, silicon on insulator (SOT) substrate, silicon on sapphire (SOS) substrate, for instance, and can include various doped and/or undoped semiconductor materials. A heater material 310 is formed on plugs 330-1, . . . , 330-4 and can be various conductive materials, such as metal nitride, e.g., titanium nitride, tungsten nitride, among other conductive materials.

Figure 3B:
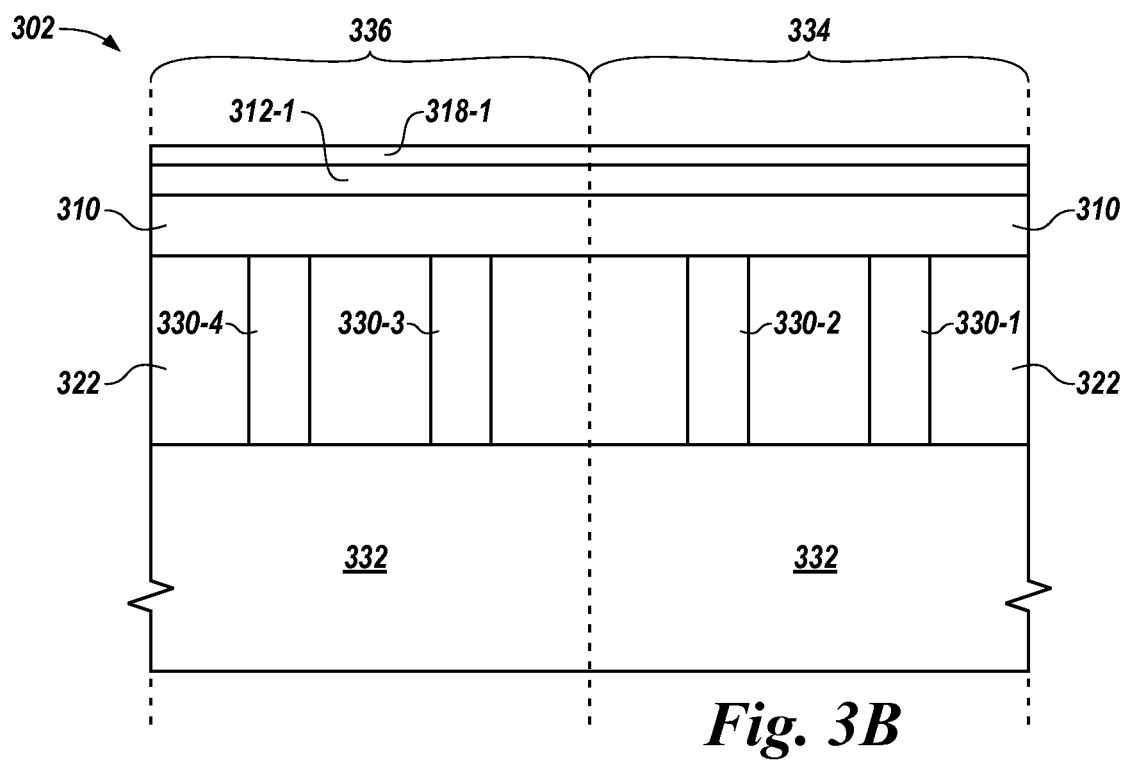

FIG. 3B illustrates a process stage subsequent to that shown in FIG. 3A and associated with forming array 302. A resistance variable material 312-1, e.g., a phase change material, is formed on heater material 310. That is, the heater material 310 of regions 334 and 336 includes resistance variable material 312-1 formed thereon. As is further illustrated in FIG. 3B, a cap material 318-1 is formed on resistance variable material 312-1 in regions 334 and 336.

Figure 3C:
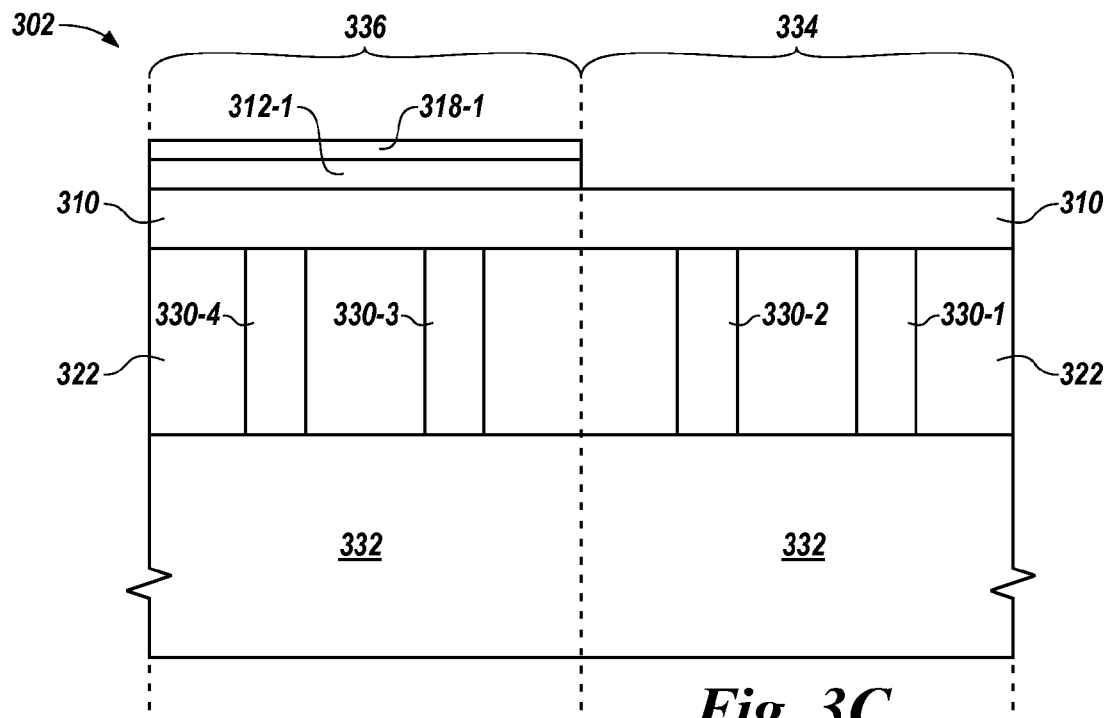

FIG. 3C illustrates a portion of resistance variable material 312-1 and cap material 318-1 removed from region 334 of array 302. The portions of materials 312-1 and 318-1 can be removed from region 334 via an etch process, for instance, without removing portions of materials 312-1 and 318-1 in region 336 of array 302.

Figure 3D:
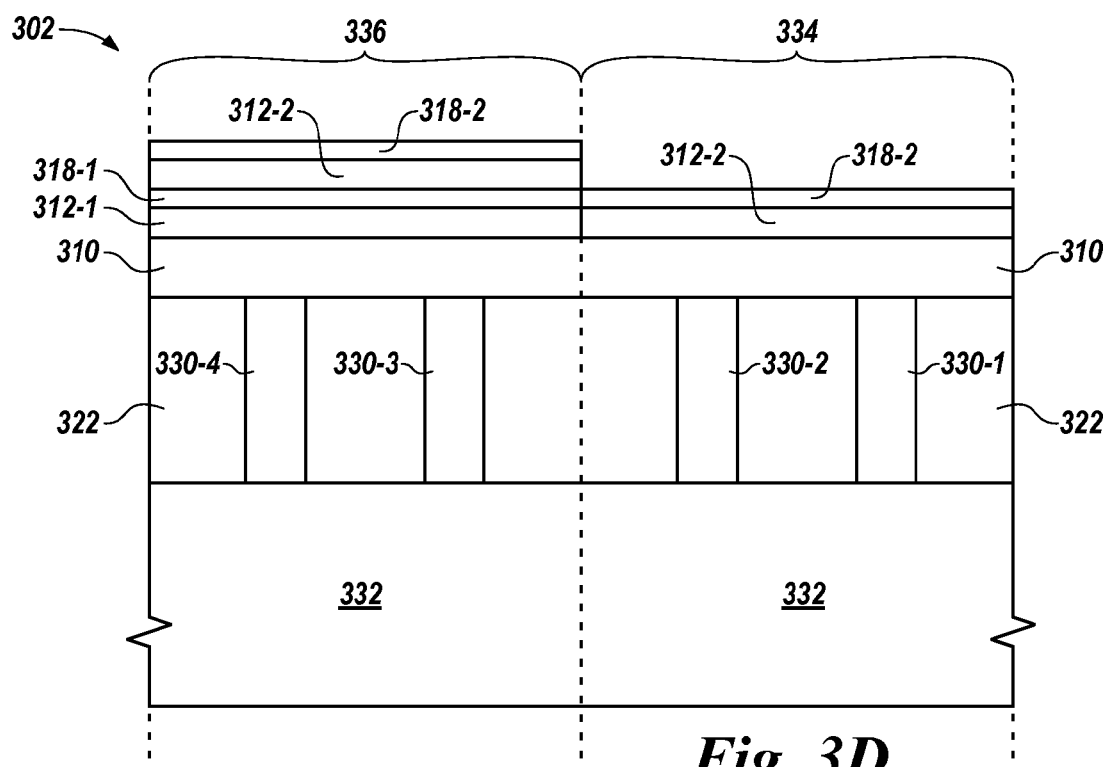

FIG. 3D illustrates a process stage subsequent to that shown in FIG. 3C and associated with forming array 302. FIG. 3D illustrates resistance variable material 312-2 formed on heater material 310 in region 334 and cap material 318-1 in region 336 of array 302. FIG. 3D also illustrates cap material 318-2, e.g., a conductive material, formed on resistance variable material 312-2 in regions 334 and 336.

Figure 3E:
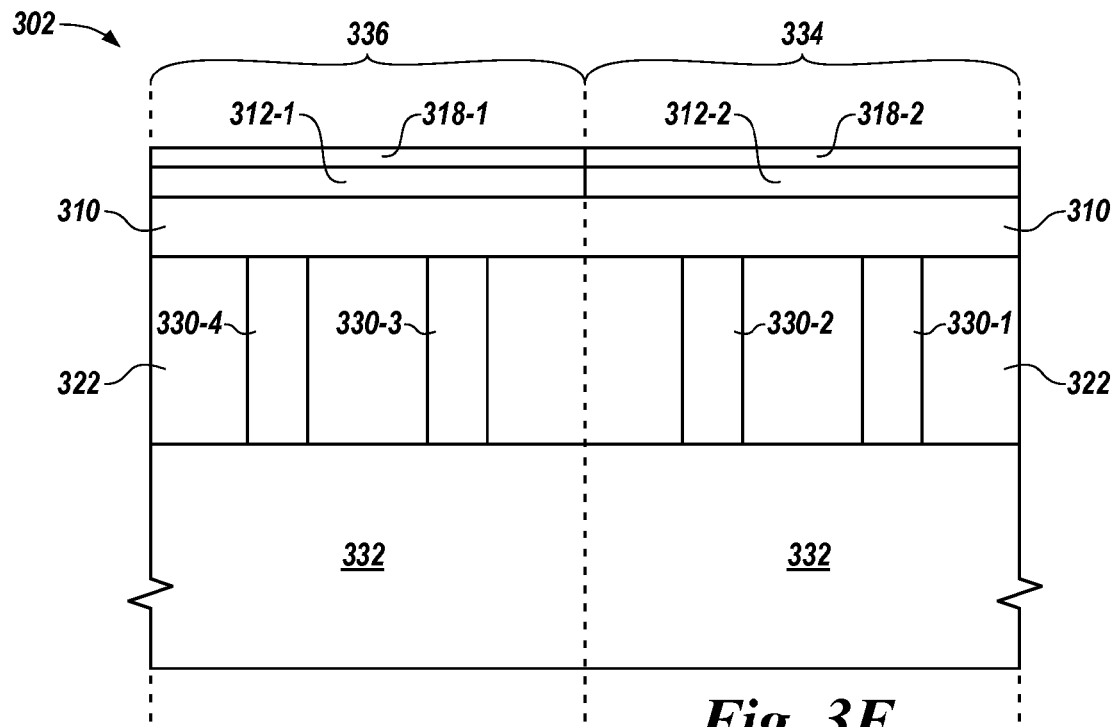

FIG. 3E illustrates a portion of resistance variable material 312-2 and cap material 318-2 removed from region 336 of array 302. Removing resistance variable material 312-2 from region 336 of array 302 can result in a smooth region, including heater material 310, resistance variable material 312-1, and cap material 318-1 in region 336 of array 302. Region 334 of example array 302 can also be a smooth region, including heater material 310, resistance variable material 312-2, and cap material 318-2. In a number of embodiments, cap materials 318-1 and 318-2 can serve as bit lines for the resistive memory cells.

Providing different materials, e.g., resistance variable materials 312-1 and 312-2, in different regions, e.g., regions 334 and 336, of an array can be used to form memory cells having different cell characteristics, e.g., electrothermal properties, within the respective array regions. For example, resistance variable material 312-1 can act differently within region 336 of array 302 than 312-2 acts within region 334 of array 302. As such, properties of the resistance variable materials 312-1 and 312-2 in regions 336 and 334 may be different, and resistive memory cells formed in region 334 can exhibit different cell characteristics as compared to the cell characteristics of cells formed in region 336.

Figure 3F:
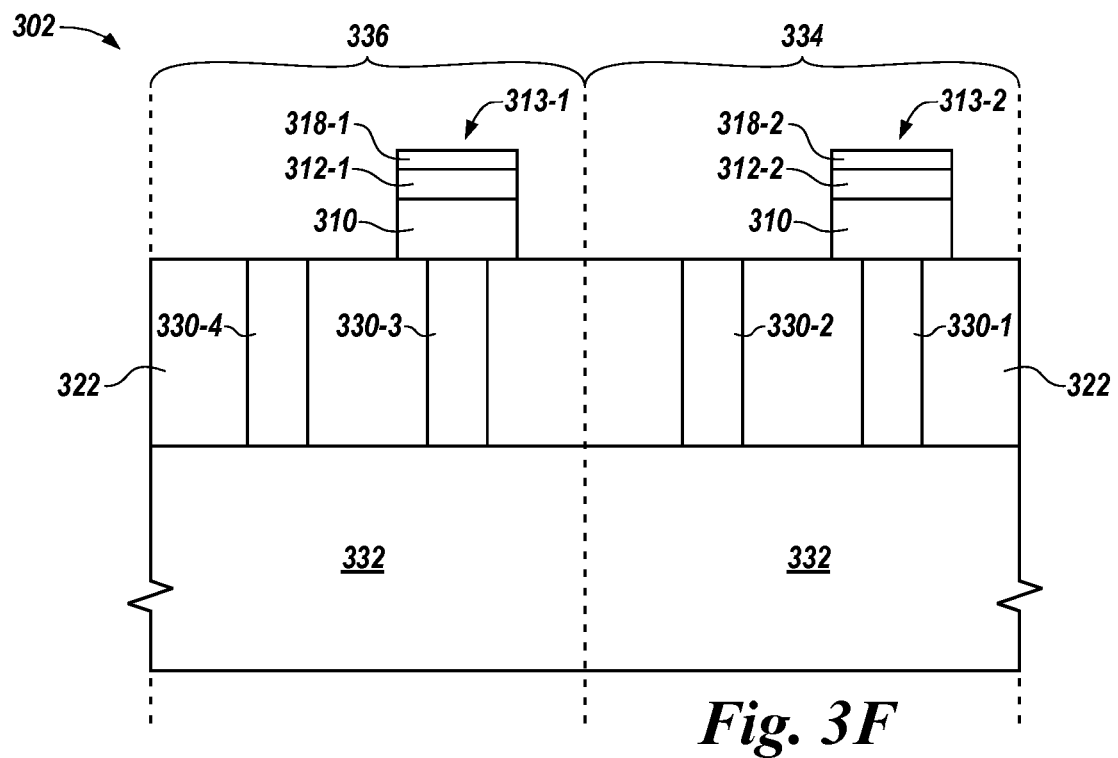

FIG. 3F illustrates a process stage subsequent to that shown in FIG. 3E and associated with forming array 302. As shown in FIG. 3F, individual resistive memory cells 313-1 and 313-2, e.g., separate cell stacks, can be defined by removing portions of materials 310, 312-1, 318-1, 312-2, and 318-2. In a number of embodiments, resistance variable materials 312-1 and 312-2 are between two conductive elements, e.g., between a conductive cap material 318-1 and/or 318-2 and a heater material 310. In this example, the memory cells 313-1 and 313-2 are self-aligned and can be formed via a number of masking and etching processes, for instance.

Although the example shown in FIGS. 3A-3F is for an array of phase change materials, embodiments are not so limited. For instance, in a number of embodiments, the array 302 can be an array of RRAM cells or other resistive memory cells having separate regions with different cell characteristics.

FIGS. 4A-4I illustrate various process stages associated with forming an array 402 of resistive memory cells in accordance with a number of embodiments of the present disclosure. The memory cells of array 402 can be resistive memory cells such as resistive memory cells 104, as described above with respect to FIG. 1. As an example, the array 402 can be an array of phase change memory cells, but is not so limited.

Figure 4A:
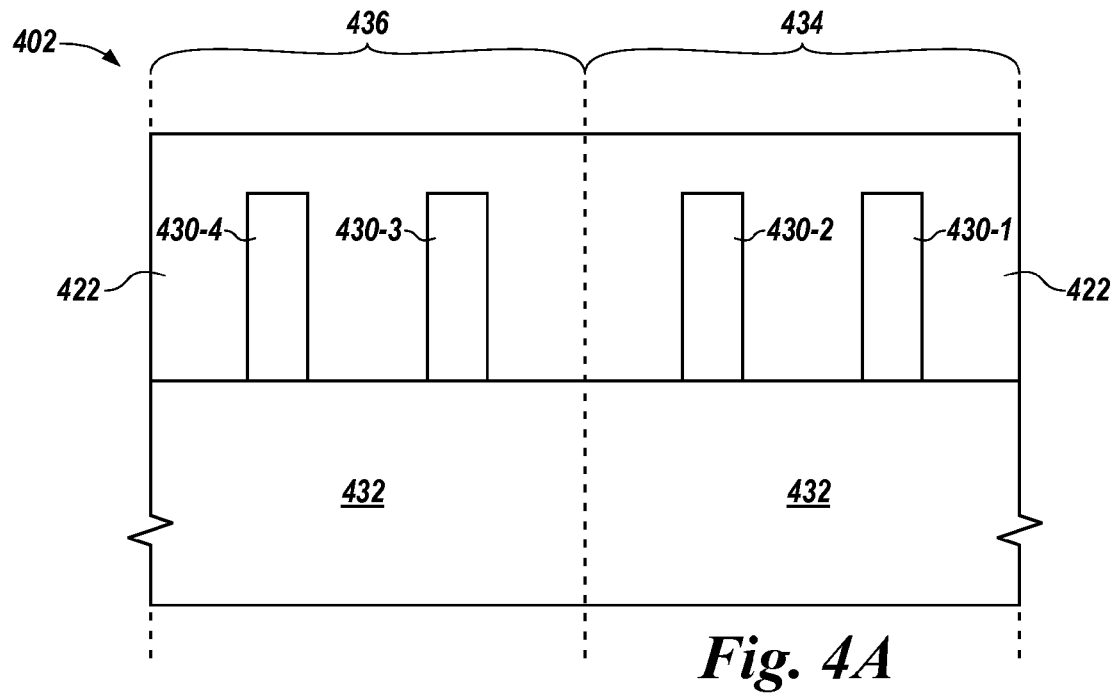
FIGS. 4A-4I illustrate various process stages associated with forming an array of resistive memory cells in accordance with a number of embodiments of the present disclosure.

FIG. 4A illustrates a first region 434 and a second region 436 of array 402. In the example shown in FIG. 4A, regions 434 and 436 of array 402 include conductive plugs 430-1, . . . , 430-4 separated by a dielectric material 422 formed on a substrate material 432. The dielectric material 422 can be a material such as silicon dioxide or silicon nitride, for instance. The substrate 432 can be a silicon substrate, silicon on insulator (SOI) substrate, silicon on sapphire (SOS) substrate, for instance, and can include various doped and/or undoped semiconductor materials.

Figure 4B:
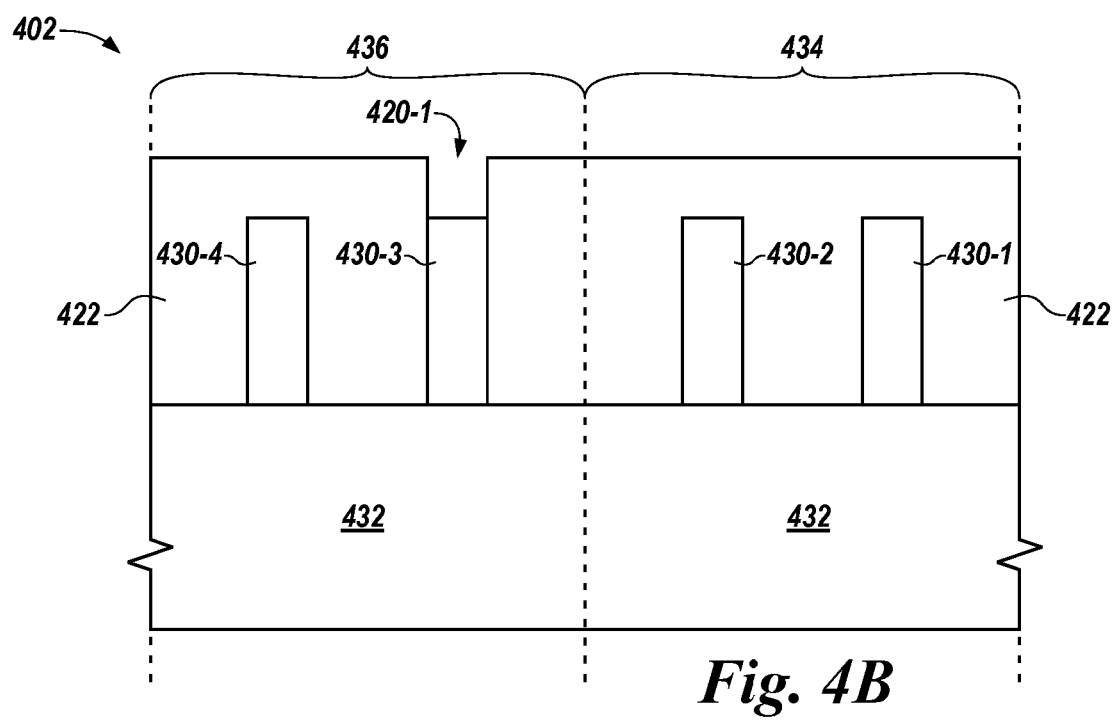

FIG. 4B illustrates a process stage subsequent to that shown in FIG. 4A and associated with forming array 402. A via 420-1 is formed in a portion of region 436, within dielectric material 422. Via 420-1 can be aligned with a conductive plug in region 436, e.g., plug 430-3.

Figure 4C:
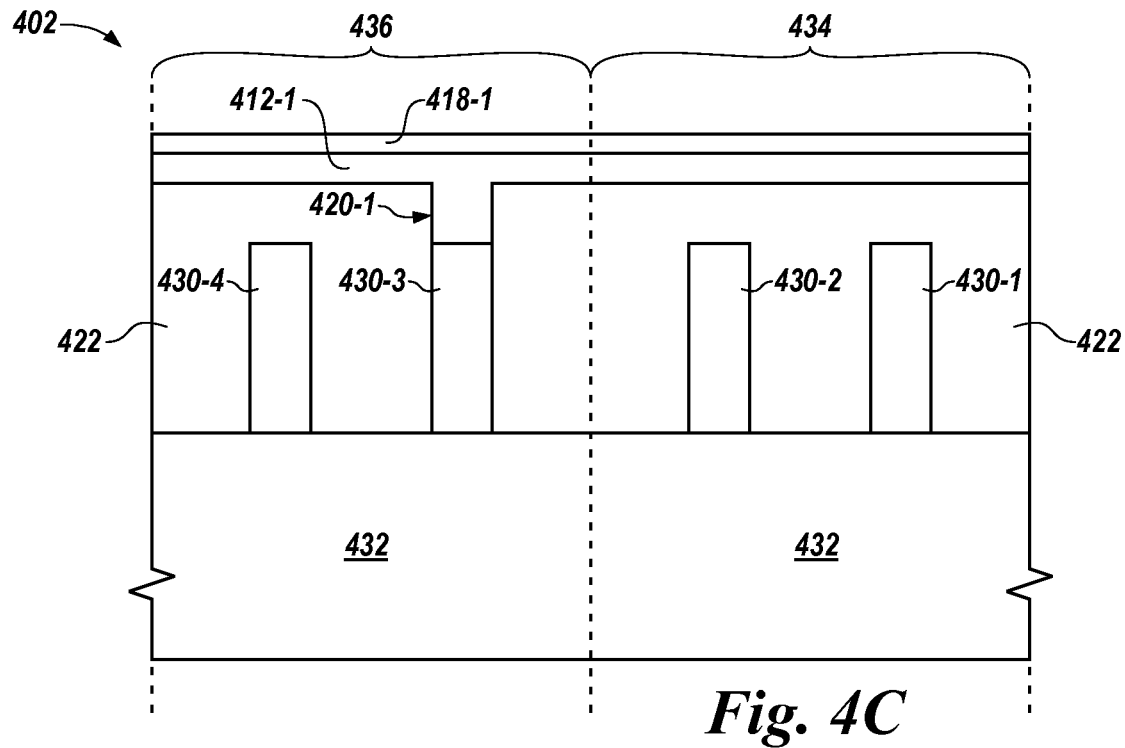

FIG. 4C illustrates a process stage subsequent to that shown in FIG. 4B and associated with forming array 402. A resistance variable material 412-1 is formed on dielectric 422 in region 434 and region 436 of array 402. As further illustrated in FIG. 4C, resistance variable material 412-1 fills via 420-1. A cap material 418-1, e.g., a conductive material, is formed on resistance variable material 412-1 and can comprise a number of conductive materials, including, for example, tungsten.

Figure 4D:
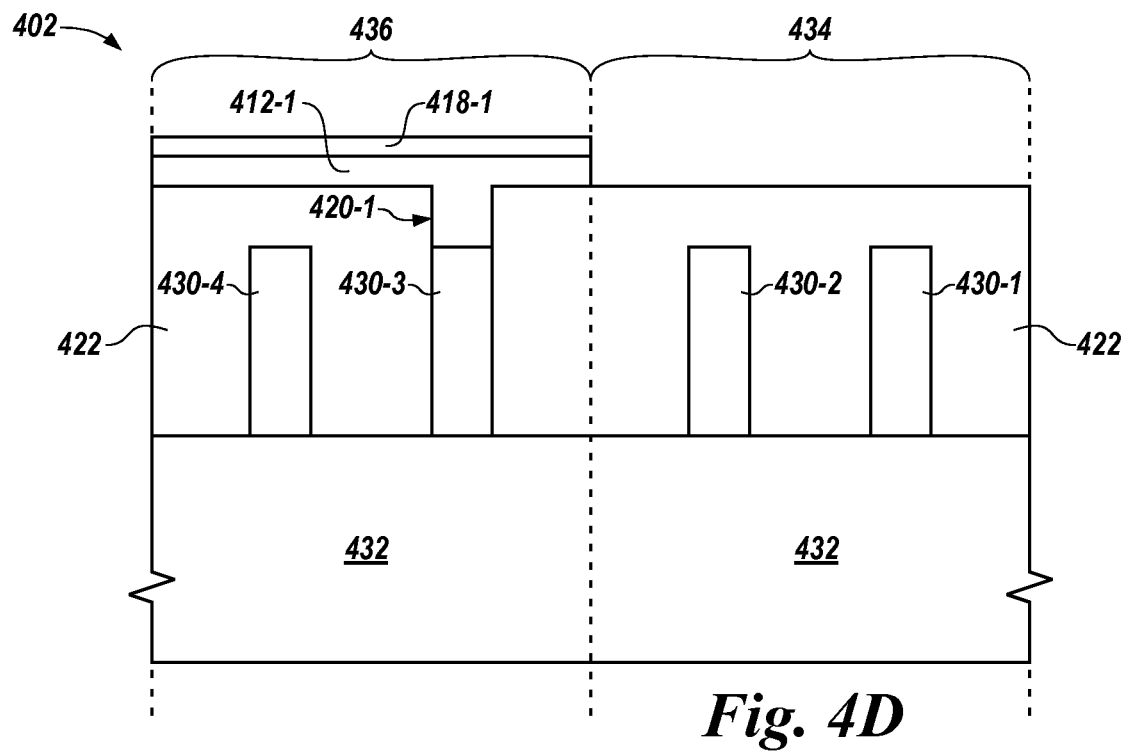

FIG. 4D illustrates a portion of resistance variable material 412-1 and a portion of cap material 418-1 removed from region 434 of array 402. The materials 412-1 and 418-1 can be removed from region 434 via an etch process, for instance, without removing materials 412-1 and 418-1 from region 436.

Figure 4E:
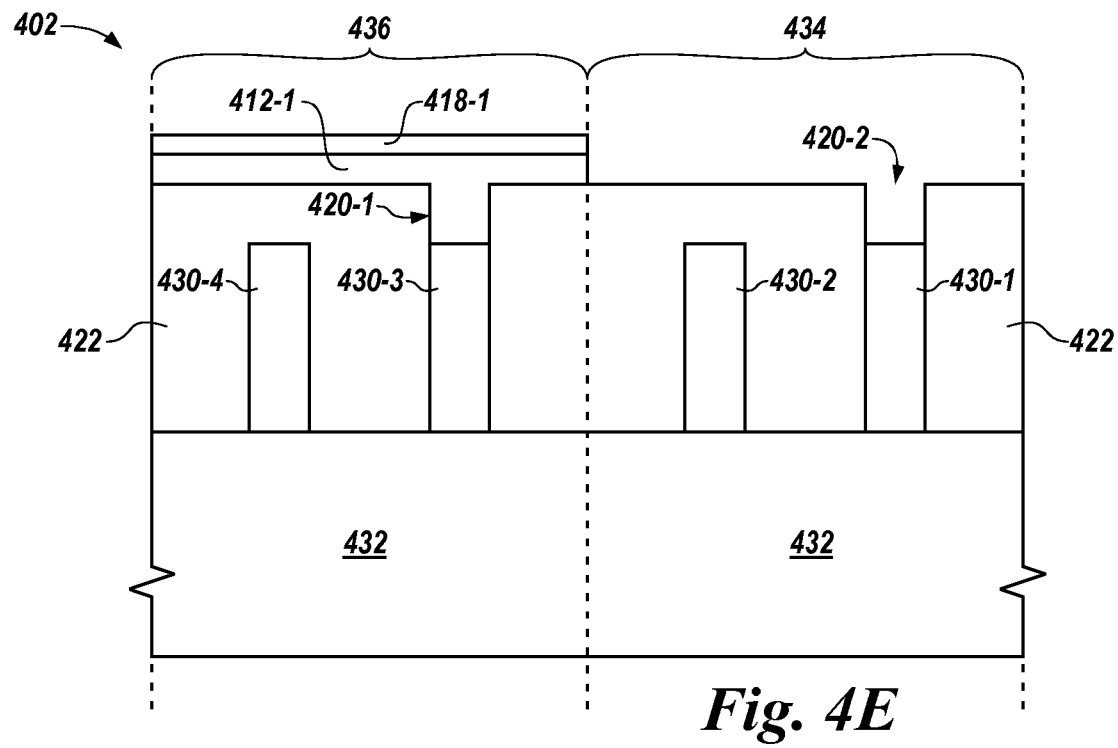

FIG. 4E illustrates a process stage subsequent to that shown in FIG. 4D and associated with forming array 402. A via 420-2 is formed in a portion of region 434, within dielectric material 422. Via 420-2 can be aligned with a conductive plug in region 434, e.g., plug 430-1.

Figure 4F:
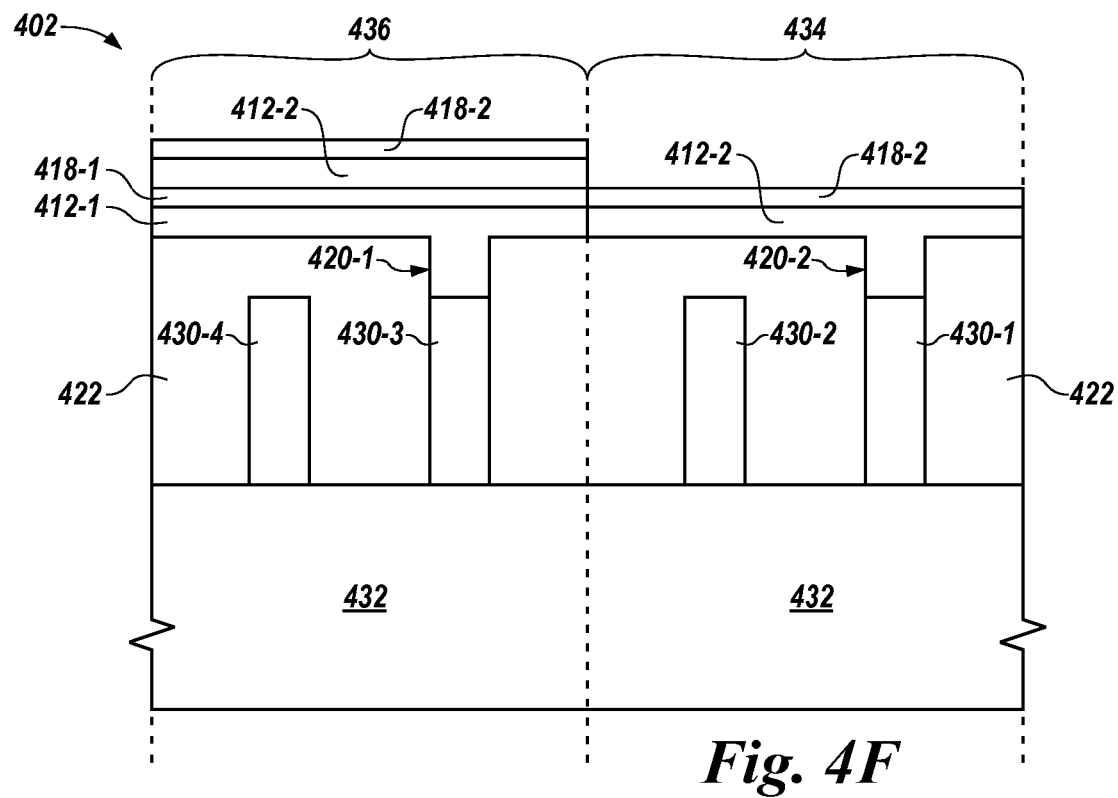

FIG. 4F illustrates a process stage subsequent to that shown in FIG. 4E and associated with forming array 402. A resistance variable material 412-2 is formed on dielectric 422 in regions 434 and on cap material 418-1 in region 436 of array 402. As further illustrated in FIG. 4F, resistance variable material 412- fills via 420-2. A cap material 418-2 is formed on resistance variable material 412-2 in regions 436 and 434 and can comprise a number of conductive materials, including, for example, tungsten.

Figure 4G:
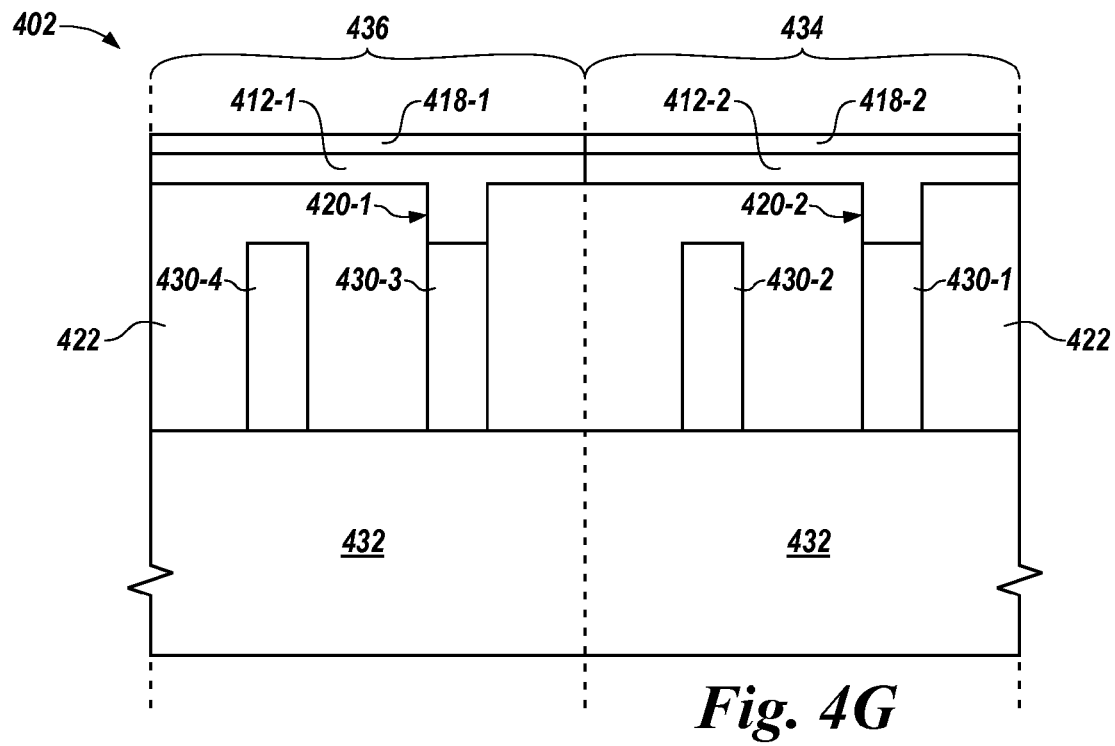

FIG. 4G illustrates a portion of resistance variable material 412-2 and a portion of cap material 418-2 removed from region 436 of array 402. The materials 412-2 and 418-2 can be removed from region 436 via an etch process, for instance, without removing materials 412-2 and 418-2 from region 434.

Figure 4H:
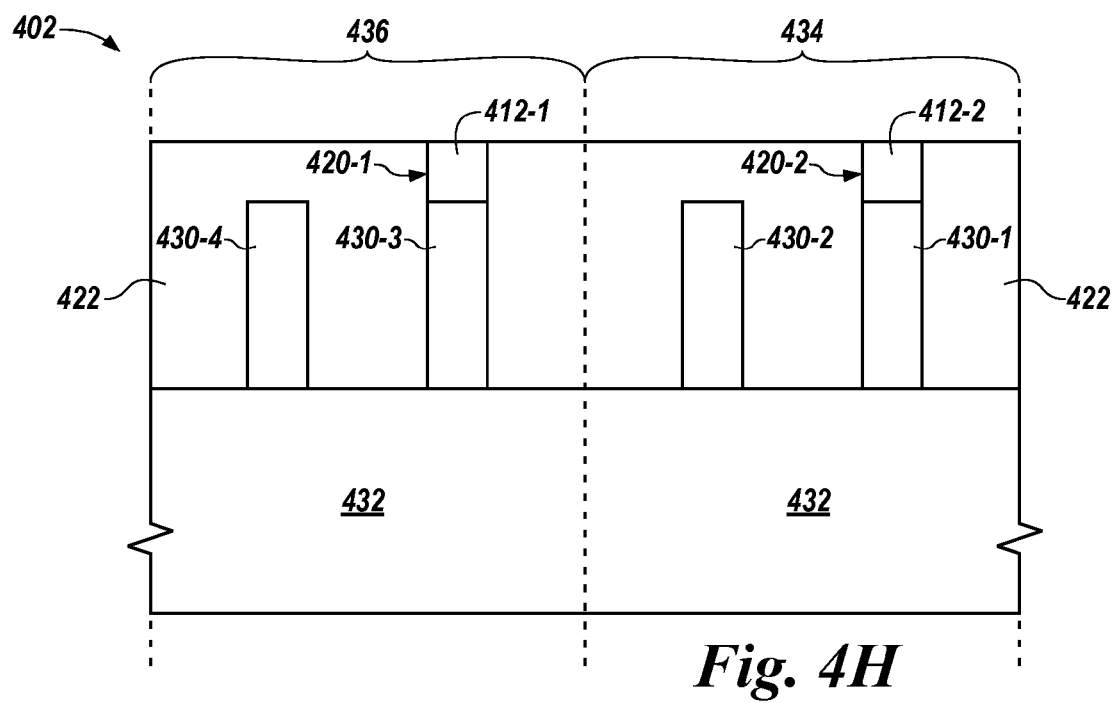

FIG. 4H illustrates a portion of resistance variable material 412-2 and a portion of cap material 418-2 removed from region 434 of array 402 and a portion of resistance variable material 412-1 and a portion of cap material 418-1 removed from region 436 of array 402. Materials 412-1, 412-2, 418-1, and 418-2 can be removed from regions 434 and 436 via an etch process, such that a portion of resistance variable material 412-1 is confined to and not removed from via 420-1, and a portion of resistance variable material 412-2 is confined to and not removed from via 420-2.

Providing different resistance variable materials, e.g., materials 412-1 and 412-2, in different regions, e.g., regions 434 and 436, of an array can be used to form memory cells having different cell characteristics, e.g., electrothermal properties, within the respective array regions. For instance, the performance characteristics of resistance variable material 412-1 in via 420-1 of region 436 may be different than the performance characteristics of resistance variable material 412-2 in via 420-1 of region 434. As such, resistive memory cells formed in region 434 can exhibit different cell characteristics as compared to cells formed in region 436.

Figure 4I:
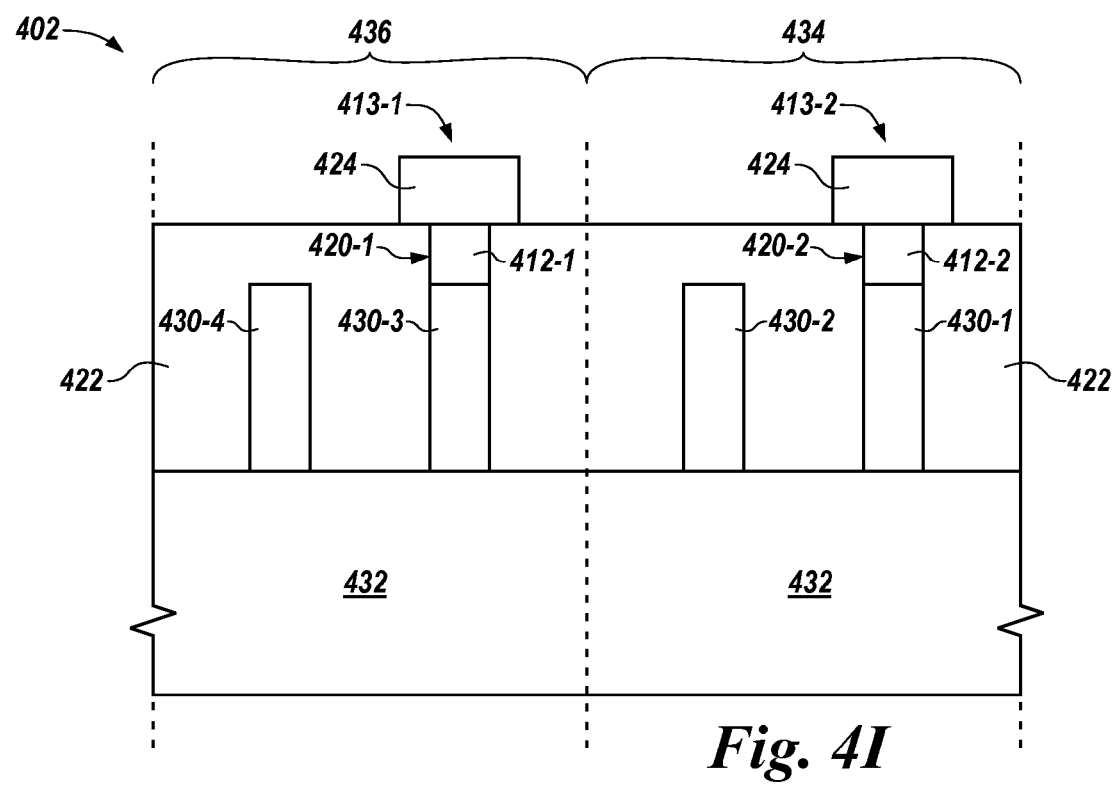

FIG. 4I illustrates a process stage subsequent to that shown in FIG. 4H and associated with forming array 202. A metal material 424, e.g., a copper material, is formed on resistance variable material 412-1 and resistance variable material 412-2. Metal material 424 can be formed using a damascene process, and in a number of embodiments, metal material 424 can serve as a cap material, an electrode, and/or a bit line. In a number of embodiments, resistance variable materials 412-1 and 412-2 are between two conductive elements, e.g., between a conductive cap material 318-1 and/or 318-2 and a conductive plug 430-1 and/or 430-2.

Although not shown in FIG. 4I, metal material 424 may also interact with a separate bit line. In a number of embodiments, a barrier material (not shown) can be foamed between resistance variable materials 412-1 and 412-2 and metal material 424. The barrier can comprise, for example, a metal nitride, such as, for example, titanium nitride and/or tantalum nitride.

Although the example shown in FIGS. 4A-4H is for an array of phase change memory cells, embodiments are not so limited. For instance, in a number of embodiments, the array 402 can be an array of RRAM cells or other resistive memory cells having separate regions with different cell characteristics. In the example shown in FIGS. 4A-4H, resistance variable materials 412-1 and 412-2 can comprise phase change materials formed on the conductive plugs, e.g., plugs 430-3 and 430-1. As such, the conductive plugs can serve as heaters for array 402.

FIGS. 5A-5E illustrate various process stages associated with forming an array 502 of resistive memory cells in accordance with a number of embodiments of the present disclosure. The memory cells of array 502 can be resistive memory cells such as resistive memory cells 104, as described above. As an example, the array 502 can be an array of phase change memory cells.

Figure 5A:
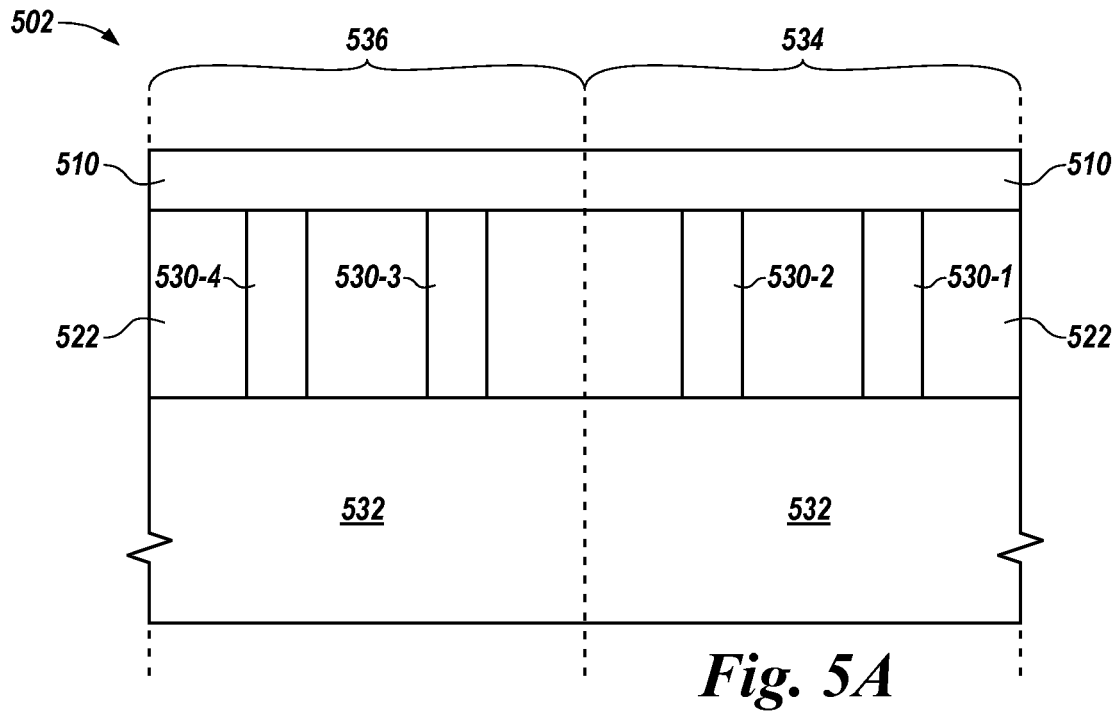
FIGS. 5A-5E illustrate various process stages associated with forming an array of resistive memory cells in accordance with a number of embodiments of the present disclosure.

FIG. 5A illustrates a first region 534 and a second region 536 of array 502. In the example shown in FIG. 5A, regions 534 and 536 include conductive plugs 530-1, ..., 530-4 formed between a heater material 510, e.g., a conductive material, and a substrate 532. In a number of embodiments, heater material 510 is limited in a direction perpendicular to the rows of memory cells (not shown) prior to a material, e.g., a resistance variable material, being formed on the heater material 510.

The conductive plugs 530-1, ..., 530-4 are separated by a dielectric material 522 formed on substrate 532. The dielectric material 522 can be a material such as silicon dioxide or silicon nitride, for instance. The substrate 532 can be a silicon substrate, silicon on insulator (SOI) substrate, silicon on sapphire (SOS) substrate, for instance, and can include various doped and/or undoped semiconductor materials. The heater material 510 is formed on plugs 530-1, ..., 530-4 and can be various conductive materials such as metal nitride, e.g., tungsten nitride and/or titanium nitride, among other conductive materials.

Figure 5B:
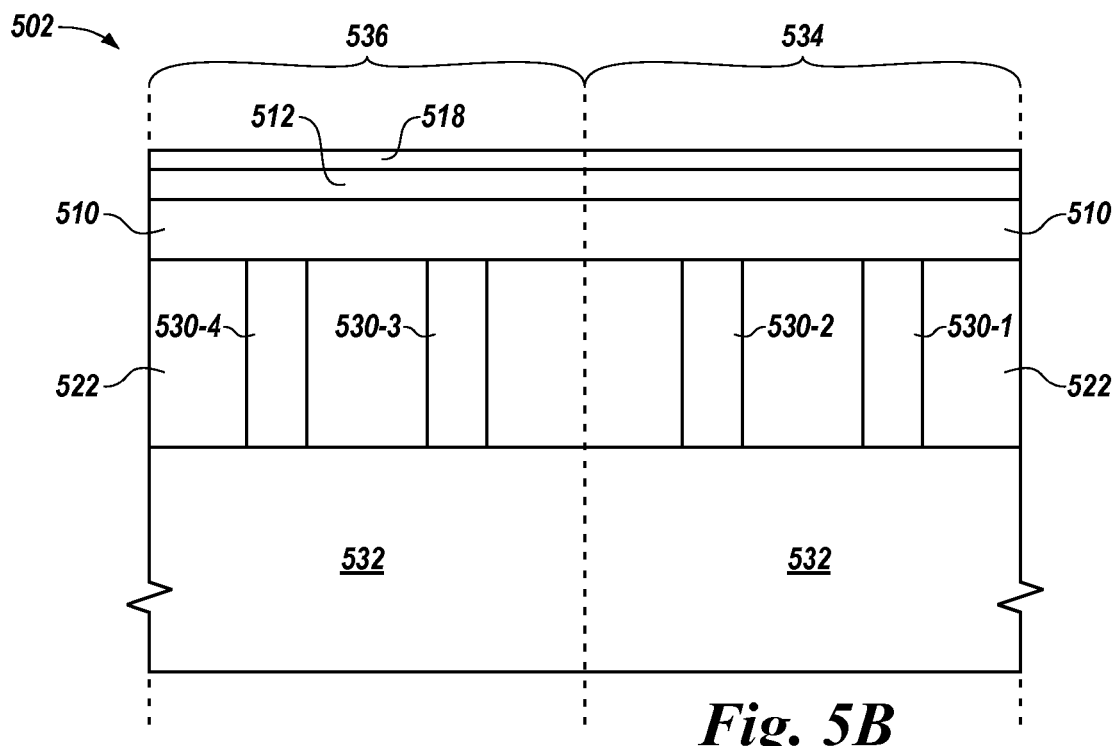

FIG. 5B illustrates a process stage subsequent to that shown in FIG. 5A and associated with forming array 502. A resistance variable material 512, e.g., a phase change material, is formed on heater material 510. That is, the heater material 510 of regions 534 and 536 includes resistance variable material 512 formed thereon.

As illustrated in FIG. 5B, a cap material 518, e.g., a conductive material, is formed on the resistance variable material 512 in regions 234 and 236. The cap material 518 can comprise, for example, a metal nitride such as titanium nitride and/or tungsten nitride, among various other cap materials.

Figure 5C:
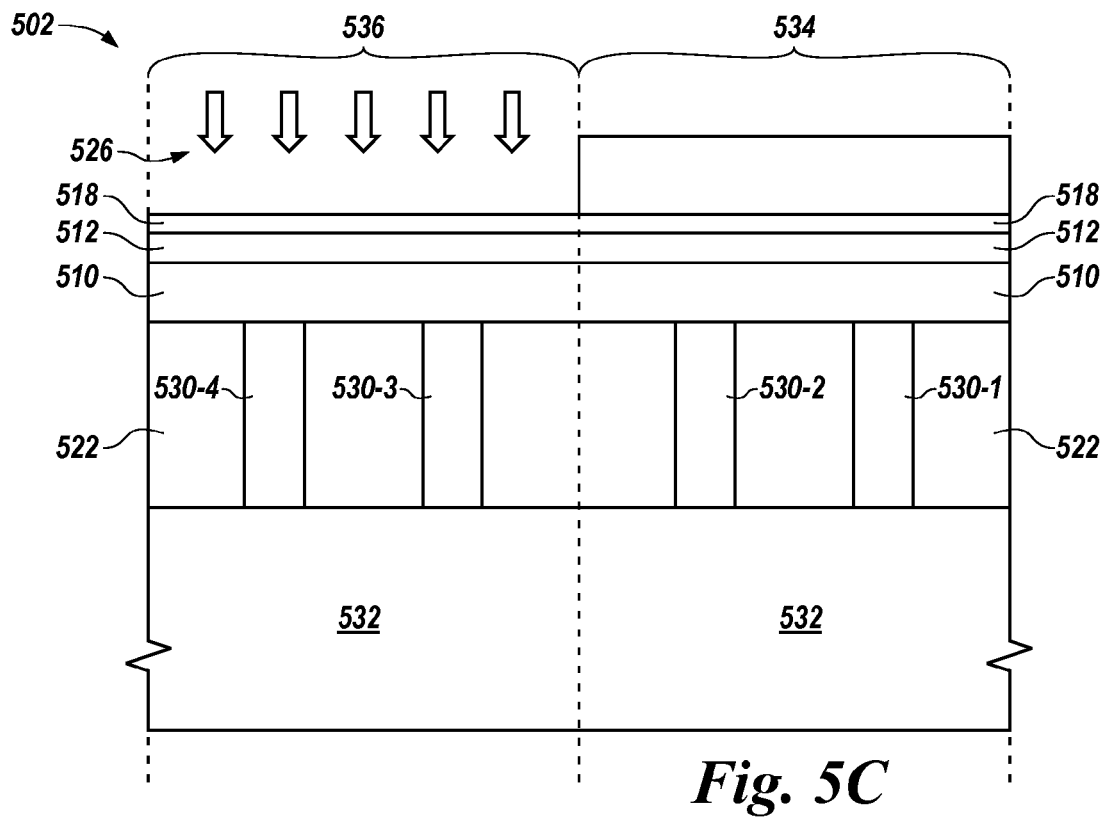

FIG. 5C illustrates a process stage subsequent to that shown in FIG. 5B and associated with forming array 502. Arrows 526 represent ion implantation on at least a portion of region 536. In a number of embodiments, as a result of the ion implantation, an electrothermal property of resistance variable material 512 is modified in at least a portion of region 536.

Figure 5D:
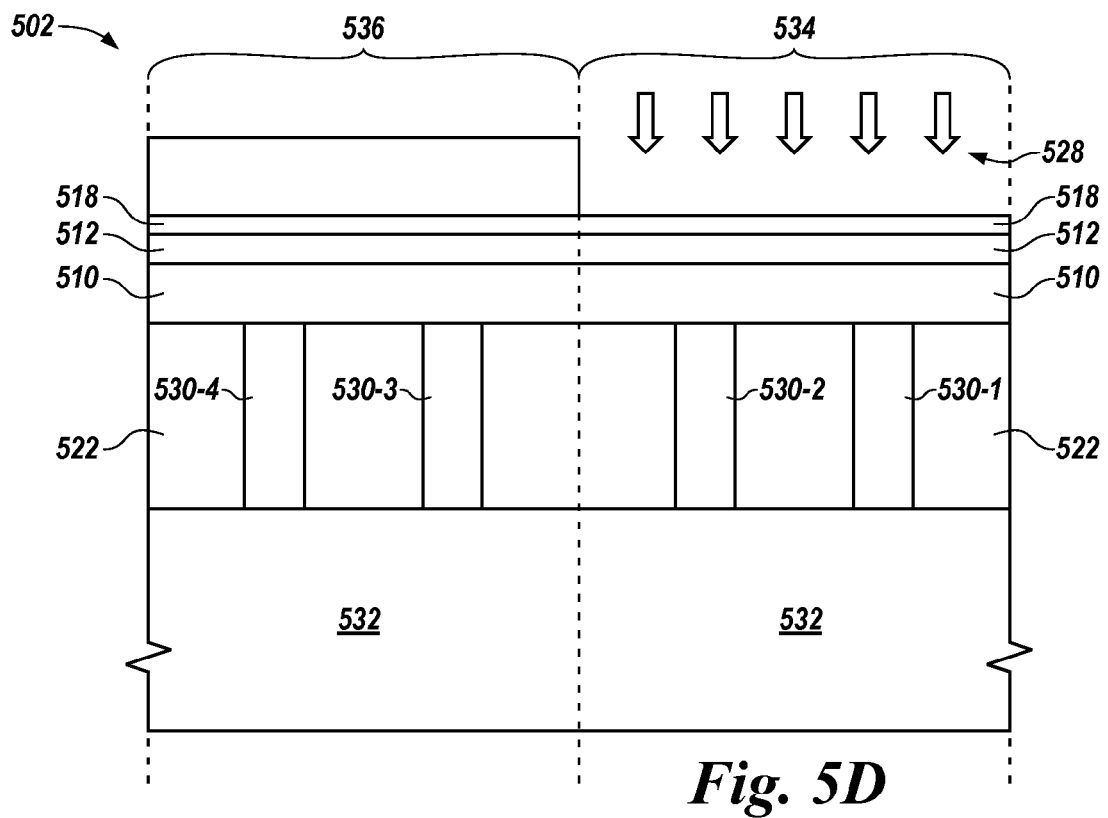

FIG. 5D illustrates a process stage subsequent to that shown in FIG. 5C and associated with forming array 502. Arrows 528 represent ion implantation on at least a portion of region 534. In a number of embodiments, as a result of the ion implantation, an electrothermal property of resistance variable material 512 is modified in at least a portion of region 534. It may be sufficient, in various embodiments, to perform ion implantation on at least a portion of region 536, but not region 534, (and vice versa) to differentiate electrothermal properties between resistance variable material 512 in each of regions 534 and 536.

In a number of embodiments, ion implantation processes, e.g., as represented by arrows 526 and/or 528, can include implantation of different types of ions in the respective regions 536 and 534. The ions can be implanted through cap material 518, for example, and can include implantation of ions such as arsenic, phosphorus, and/or boron, among other ions. In a number of embodiments, the implanted ions can be metal ions. The implantation processes 526 and 528 can have different associated ion concentrations, different associated ion energies, and/or different numbers of ions.

As such, although the same resistance variable material 512 is formed in regions 534 and 536, the ion implantation processes 526 and/or 528 can be used to modify the electrothermal properties of the material 512 within the respective regions 536 and 534. Therefore, the memory cells formed in regions 536 and 534 can have different cell characteristics associated therewith. In a number of embodiments, modifying the electrothermal properties of the material 512 can include thermal activation to modify the electrothermal properties of the resistance variable material 512 within regions 536 and 534. The thermal activation can apply to ion implantation processes 526 and/or 528, and thermal activation can also apply to a reactant material processes.

Figure 5E:
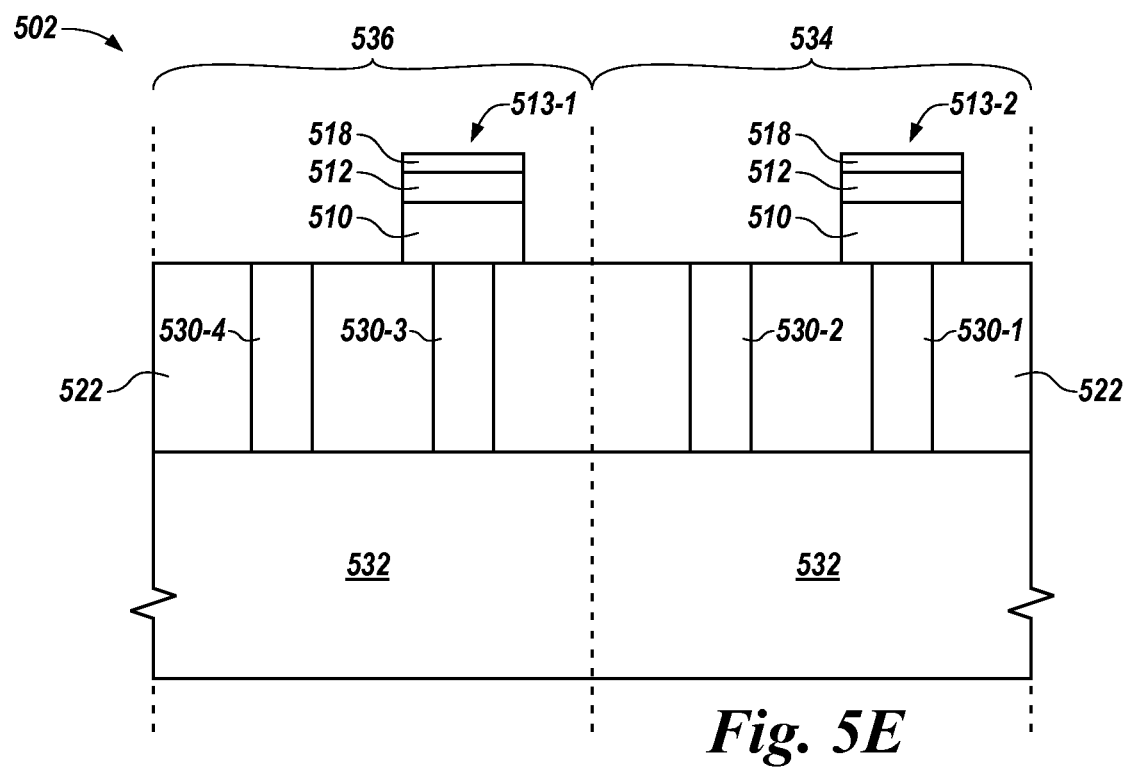

FIG. 5E illustrates a process stage subsequent to that shown in FIG. 5D and associated with forming array 502. As shown in FIG. 5E, individual resistive memory cells 513-1 and 513-2 can be defined by removing portions of materials 510, 512, and 518. In a number of embodiments, resistance variable material 512 is between two conductive elements, e.g., between a conductive cap material 518 and a heater material 510.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of Equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method of forming an array of resistive memory cells, the method comprising:

forming a first number of resistive memory cells in a first region of the array and a second number of resistive memory cells in a second region of the array; and modifying an electrothermal property of a resistance variable material in at least one of the first region of the array and the second region of the array, wherein modifying the electrothermal property of the resistance variable material in the at least one of the first and second regions includes thermal activation to modify the electrothermal properties of the resistance variable material in the first and second regions of the array.

2. The method of claim 1, wherein modifying the electrothermal property of the resistance variable material in the at least one of the first and second regions includes at least one of performing a first ion implantation process on at least a portion of the first region and performing a second ion implantation on at least a portion of the second region.

3. The method of claim 2, wherein performing the at least one of the first implantation process and the second ion implantation process includes implanting ions through a cap material formed on the resistance variable material.

4. The method of claim 1, wherein modifying the electrothermal property of the resistance variable material in the at least one of the first and second regions includes:
   forming a first reactant material on the resistance variable material in the first region; and
   forming a second reactant material on the resistance variable material in the second region.

5. The method of claim 1, wherein modifying the electrothermal property of the resistance variable material in the at least one of the first and second regions includes:
   forming a reactant material of a first thickness on the resistance variable material in the first region; and
   forming the reactant material of a different thickness on the resistance variable material in the second region.

6. The method of claim 4, wherein modifying the electrothermal property of the resistance variable material in the at least one of the first and second regions includes:
   removing a portion of the first reactant material;
   forming the second reactant material where the portion of the first reactant material was removed and on the resistance variable material in the second region;
   forming a cap material on the second reactant material; and
   forming separate cell stacks corresponding to the respective first and second resistive memory cells.

7. The method of claim 1, wherein modifying the electrothermal property of the resistance variable material in the at least one of the first and second regions includes:
   performing a first ion implantation process using an ion of a first concentration on at least a portion of the first region; and
   performing a second ion implantation using an ion of a second concentration on at least a portion of the second region,
   wherein the first ion concentration is different than the second ion concentration.

* * * * *